United States Patent
Yang

(10) Patent No.: US 8,472,897 B1
(45) Date of Patent: Jun. 25, 2013

(54) POWER AMPLIFIER PREDISTORTION METHODS AND APPARATUS

(75) Inventor: Dali Yang, Mountain View, CA (US)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 616 days.

(21) Appl. No.: 11/962,025

(22) Filed: Dec. 20, 2007

Related U.S. Application Data

(60) Provisional application No. 60/876,640, filed on Dec. 22, 2006.

(51) Int. Cl.
*H04B 1/04* (2006.01)

(52) U.S. Cl.
USPC ......... 455/114.3; 330/149; 375/296; 375/297

(58) Field of Classification Search
USPC ............. 455/114.3, 127.2, 127.1, 115.1, 341, 455/239.1; 375/296, 297, 260; 330/149, 127, 330/278, 291, 2, 96, 296
See application file for complete search history.

(56) References Cited

U.S. PATENT DOCUMENTS

| | | |
|---|---|---|
| 4,638,248 A | 1/1987 | Schweickert |
| 4,700,151 A | 10/1987 | Nagata |
| 4,890,300 A | 12/1989 | Andrews |
| 4,929,906 A | 5/1990 | Voyce et al. |
| 5,049,832 A | 9/1991 | Cavers |
| 5,105,445 A | 4/1992 | Karam et al. |
| 5,107,520 A | 4/1992 | Karam et al. |
| 5,121,412 A | 6/1992 | Borth |
| 5,132,639 A | 7/1992 | Blauvelt et al. |
| 5,396,190 A | 3/1995 | Murata |
| 5,486,789 A | 1/1996 | Palandech et al. |
| 5,579,342 A | 11/1996 | Crozier |
| 5,589,797 A | 12/1996 | Gans et al. |
| 5,655,220 A | 8/1997 | Weiland et al. |
| 5,675,287 A | 10/1997 | Baker et al. |
| 5,678,198 A | 10/1997 | Lemson |
| 5,699,383 A | 12/1997 | Ichiyoshi |
| 5,732,333 A | 3/1998 | Cox et al. |
| 5,757,229 A | 5/1998 | Mitzlaff |
| 5,786,728 A | 7/1998 | Alinikula |
| 5,870,668 A | 2/1999 | Takano et al. |
| 5,920,808 A | 7/1999 | Jones et al. |
| 5,936,464 A | 8/1999 | Grondahl |

(Continued)

OTHER PUBLICATIONS

Non-Final Office Action for U.S. Appl. No. 13/301,224 mailed on Oct. 25, 2012, 18 pages.

(Continued)

*Primary Examiner* — Edward Urban
*Assistant Examiner* — Golam Sorowar
(74) *Attorney, Agent, or Firm* — Kilpatrick Townsend & Stockton LLP

(57) ABSTRACT

An embodiment of the invention is a predistortion approach to linearize a power amplifier by setting initially the static operation point of the power amplifier in the cut-off region. The architecture is based on the analog-digital combination by a multiplier and digital predistortion control circuit. The predistortion system generates an adaptive output signal to control the RF modulated signal that is the input signal of the power amplifier. The controlled and predistorted signal can contribute to drive a power amplifier with the cut-off static operation point into its amplifying region and simultaneously correct the non-linear distortion when the power amplifier operates to amplify an RF signal.

7 Claims, 2 Drawing Sheets

U.S. PATENT DOCUMENTS

| | | | |
|---|---|---|---|
| 5,937,011 A | 8/1999 | Carney et al. | |
| 5,949,283 A | 9/1999 | Proctor et al. | |
| 5,959,499 A | 9/1999 | Khan et al. | |
| 5,963,549 A | 10/1999 | Perkins et al. | |
| 6,054,896 A | 4/2000 | Wright et al. | |
| 6,055,418 A | 4/2000 | Harris et al. | |
| 6,081,158 A | 6/2000 | Twitchell et al. | |
| 6,091,941 A | 7/2000 | Moriyama et al. | |
| 6,240,144 B1 | 5/2001 | Ha | |
| 6,242,979 B1 | 6/2001 | Li | |
| 6,246,286 B1 | 6/2001 | Persson | |
| 6,246,865 B1 | 6/2001 | Lee | |
| 6,252,912 B1 | 6/2001 | Salinger | |
| 6,275,685 B1 | 8/2001 | Wessel et al. | |
| 6,301,579 B1 | 10/2001 | Becker | |
| 6,313,703 B1 | 11/2001 | Wright et al. | |
| 6,314,142 B1 | 11/2001 | Perthold et al. | |
| 6,356,555 B1 | 3/2002 | Rakib et al. | |
| 6,373,902 B1 | 4/2002 | Park et al. | |
| 6,388,518 B1 | 5/2002 | Miyataini | |
| 6,400,774 B1 | 6/2002 | Matsuoka et al. | |
| 6,424,225 B1 | 7/2002 | Choi et al. | |
| 6,489,846 B2 | 12/2002 | Hatsugai | |
| 6,512,417 B2 | 1/2003 | Booth et al. | |
| 6,552,634 B1 | 4/2003 | Raab | |
| 6,625,429 B1 | 9/2003 | Yamashita | |
| 6,639,050 B1 | 10/2003 | Kieliszewski | |
| 6,677,870 B2 | 1/2004 | Im et al. | |
| 6,697,436 B1 | 2/2004 | Wright et al. | |
| 6,703,897 B2 | 3/2004 | O'Flaherty et al. | |
| 6,741,663 B1 | 5/2004 | Tapio et al. | |
| 6,741,867 B1 | 5/2004 | Tetsuya | |
| 6,747,649 B1 | 6/2004 | Sanz-Pastor et al. | |
| 6,751,447 B1 | 6/2004 | Jin et al. | |
| 6,885,241 B2 | 4/2005 | Huang et al. | |
| 6,963,242 B2 | 11/2005 | White et al. | |
| 6,983,025 B2 | 1/2006 | Schell | |
| 6,985,704 B2 | 1/2006 | Yang et al. | |
| 6,998,909 B1 | 2/2006 | Mauer | |
| 7,023,273 B2 | 4/2006 | Johnson et al. | |
| 7,035,345 B2 | 4/2006 | Jeckeln et al. | |
| 7,042,287 B2 | 5/2006 | Robinson | |
| 7,061,314 B2 | 6/2006 | Kwon et al. | |
| 7,064,606 B2 | 6/2006 | Louis | |
| 7,071,777 B2 | 7/2006 | McBeath et al. | |
| 7,079,818 B2 * | 7/2006 | Khorram | 455/115.1 |
| 7,098,734 B2 | 8/2006 | Hongo et al. | |
| 7,102,442 B2 | 9/2006 | Anderson | |
| 7,103,329 B1 | 9/2006 | Thon | |
| 7,104,310 B2 | 9/2006 | Hunter | |
| 7,106,806 B1 * | 9/2006 | Kenington | 375/297 |
| 7,109,792 B2 | 9/2006 | Leffel | |
| 7,109,998 B2 | 9/2006 | Smith | |
| 7,123,890 B2 | 10/2006 | Kenington et al. | |
| 7,151,913 B2 | 12/2006 | Ahmed | |
| 7,158,765 B2 | 1/2007 | Blair et al. | |
| 7,190,222 B2 | 3/2007 | Okazaki et al. | |
| 7,193,472 B2 | 3/2007 | Gotou et al. | |
| 7,248,642 B1 | 7/2007 | Vella-Coleiro | |
| 7,259,630 B2 | 8/2007 | Bachman et al. | |
| 7,321,635 B2 | 1/2008 | Ocenasek et al. | |
| 7,321,636 B2 | 1/2008 | Harel et al. | |
| 7,372,918 B2 | 5/2008 | Muller et al. | |
| 7,469,491 B2 | 12/2008 | McCallister et al. | |
| 7,831,221 B2 | 11/2010 | Leffel et al. | |
| RE42,287 E | 4/2011 | Apodaca et al. | |
| 8,064,850 B2 | 11/2011 | Yang et al. | |
| 2001/0051504 A1 | 12/2001 | Kubo et al. | |
| 2002/0025790 A1 | 2/2002 | Matsuoka | |
| 2002/0034260 A1 | 3/2002 | Kim | |
| 2002/0044014 A1 | 4/2002 | Wright et al. | |
| 2002/0080891 A1 | 6/2002 | Ahn et al. | |
| 2002/0101937 A1 | 8/2002 | Antonio et al. | |
| 2002/0101938 A1 | 8/2002 | Horaguchi et al. | |
| 2002/0186783 A1 | 12/2002 | Opas et al. | |
| 2002/0187761 A1 | 12/2002 | Im et al. | |
| 2002/0193085 A1 | 12/2002 | Mathe et al. | |
| 2002/0193087 A1 | 12/2002 | Kim | |
| 2003/0095608 A1 | 5/2003 | Duperray | |
| 2003/0098752 A1 | 5/2003 | Haghighat | |
| 2003/0112068 A1 * | 6/2003 | Kenington | 330/136 |
| 2003/0179829 A1 | 9/2003 | Pinckley et al. | |
| 2003/0179830 A1 | 9/2003 | Eidson et al. | |
| 2003/0207680 A1 * | 11/2003 | Yang et al. | 455/341 |
| 2004/0017859 A1 | 1/2004 | Sills et al. | |
| 2004/0142667 A1 | 7/2004 | Lochhead et al. | |
| 2004/0240585 A1 | 12/2004 | Bishop et al. | |
| 2005/0079834 A1 | 4/2005 | Maniwa et al. | |
| 2005/0159117 A1 * | 7/2005 | Bausov et al. | 455/127.1 |
| 2005/0226346 A1 | 10/2005 | Ode et al. | |
| 2005/0262498 A1 * | 11/2005 | Ferguson et al. | 717/172 |
| 2006/0012426 A1 * | 1/2006 | Nezami | 330/149 |
| 2006/0046665 A1 | 3/2006 | Yang et al. | |
| 2006/0067426 A1 * | 3/2006 | Maltsev et al. | 375/297 |
| 2006/0109052 A1 * | 5/2006 | Saed et al. | 330/149 |
| 2006/0121858 A1 * | 6/2006 | Tanaka et al. | 455/91 |
| 2006/0238245 A1 * | 10/2006 | Carichner et al. | 330/136 |
| 2006/0240786 A1 | 10/2006 | Liu | |
| 2006/0270366 A1 * | 11/2006 | Rozenblit et al. | 455/127.1 |
| 2007/0075780 A1 | 4/2007 | Krvavac et al. | |
| 2007/0171234 A1 | 7/2007 | Crawfis et al. | |
| 2007/0190952 A1 * | 8/2007 | Waheed et al. | 455/114.3 |
| 2007/0241812 A1 | 10/2007 | Yang et al. | |

OTHER PUBLICATIONS

Hilborn et al., "An Adaptive Direct Conversion Transmitter", IEEE Trans. on Vehicular Technology, vol. 43, No. 2 May 1994, pp. 223-233.

Faukner et al., "Adaptive Linearization Using Predistortion—Experimental Results", IEEE Trans. on Vehicular Technology, vol. 43, No. 2, May 1994, pp. 323-332.

Cavers, "Adaptive Behavioue of a Feed-Forward Amplifier Linearizer", IEEE Trans. on Vehicular Technology, vol. 44, No. 1, Feb. 1995, pp. 31-40.

Cavers, "Amplifier Linearization Using Digital Predistorter With Fast Adaptation and Low Memory Requirements", IEEE Trans. on Vehicular Technology, vol. 39, No. 4, Nov. 1990, pp. 374-382.

Nagata, "Linear Amplification Technique for Digital Mobile Communications", in Proc. 39th IEEE Vehicular Technology Conference, San Francisco, CA 1989, pp. 159-165.

Bernardini et al., "Analysis of Different Optimization Criteria for IF Predistortion in Digital Radio Links With Nonlinear Amplifiers", IEEE Trans. on Communications, vol. 45, No. 4, Apr. 1997.

Santella, "Performance of Adaptive Predistorters in Presence of Orthogonal Multicarrier Modulation", International Conference on Telecommunications, pp. 621-626, Melbourne, Australia, Apr. 2-5, 1997.

Office Action for related Chinese patent application No. 200780023875.1 dated Dec. 23, 2011, 6 pages.

Non-Final Office Action for U.S. Appl. No. 10/137,556 mailed on Dec. 2, 2004, 8 pages.

Notice of Allowance for U.S. Appl. No. 10/137,556 mailed on Jul. 6, 2005, 14 pages.

Non-Final Office Action for U.S. Appl. No. 12/021,241 mailed on Apr. 15, 2009, 18 pages.

Final Office Action for U.S. Appl. No. 11/262,079 mailed on May 4, 2009, 13 pages.

Non-Final Office Action for U.S. Appl. No. 11/262,079 mailed on Aug. 29, 2008, 11 pages.

Non-Final Office Action for U.S. Appl. No. 11/799,239 mailed on Oct. 29, 2009, 11 pages.

Non-Final Office Action for U.S. Appl. No. 11/262,079 mailed on Dec. 11, 2009, 16 pages.

Non-Final Office Action for U.S. Appl. No. 12/021,241 mailed on Dec. 18, 2009, 25 pages.

Final Office Action for U.S. Appl. No. 11/799,239 mailed on Jun. 24, 2010, 10 pages.

Final Office Action for U.S. Appl. No. 12/021,241 mailed on Sep. 21, 2010, 31 pages.

Notice of Allowance for U.S. Appl. No. 11/799,239 mailed on Sep. 22, 2011, 7 pages.
Non-Final Office Action for U.S. Appl. No. 12/021,241 mailed on Feb. 15, 2012, 25 pages.
Non-Final Office Action for U.S. Appl. No. 11/262,079 mailed on Mar. 26, 2012, 17 pages.

Non-Final Office Action for U.S. Appl. No. 13/301,224 mailed on May 24, 2012, 6 pages.
Notice of Allowance for U.S. Appl. No. 12/021,241 mailed on Sep. 25, 2012, 8 pages.

* cited by examiner

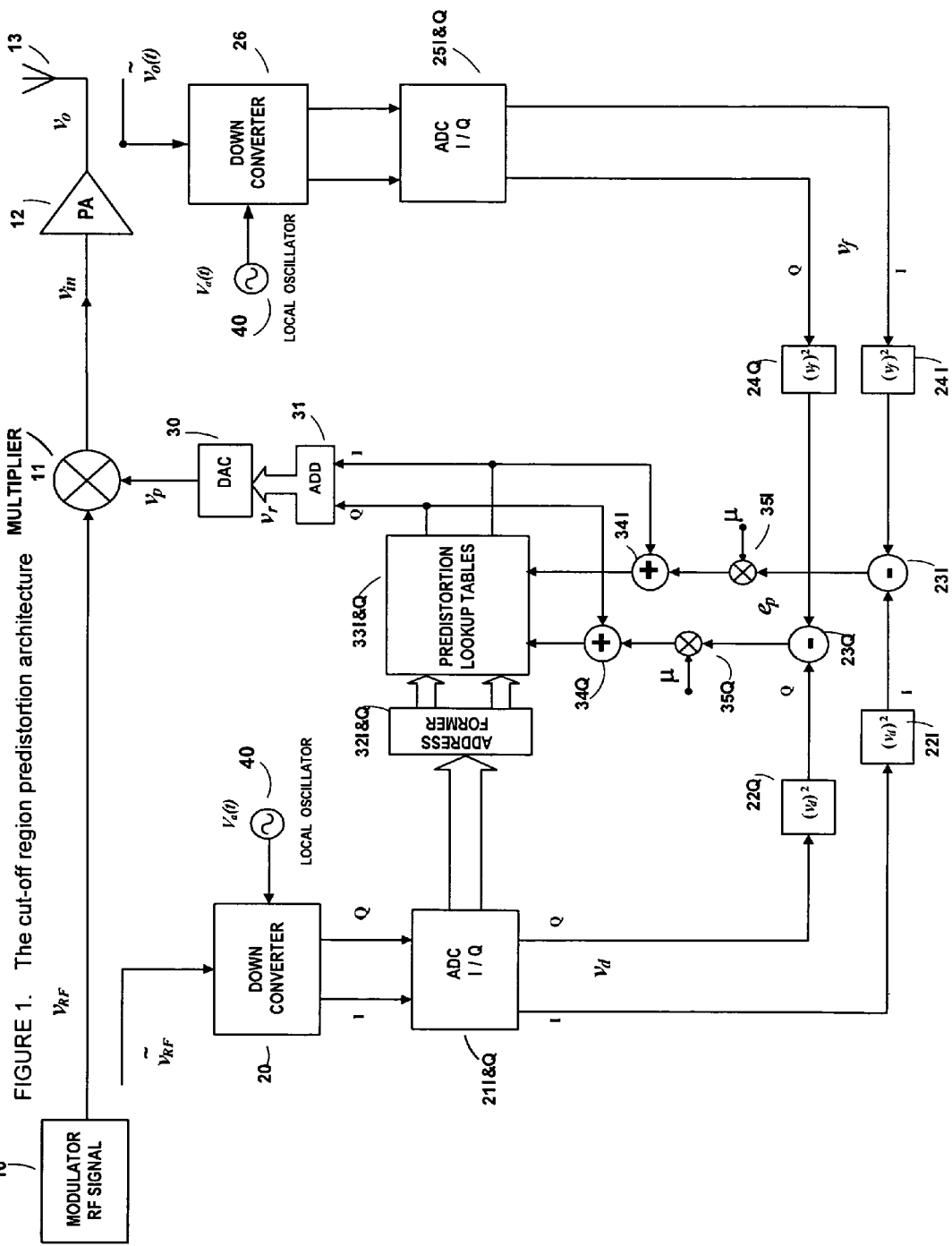
FIGURE 1. The cut-off region predistortion architecture

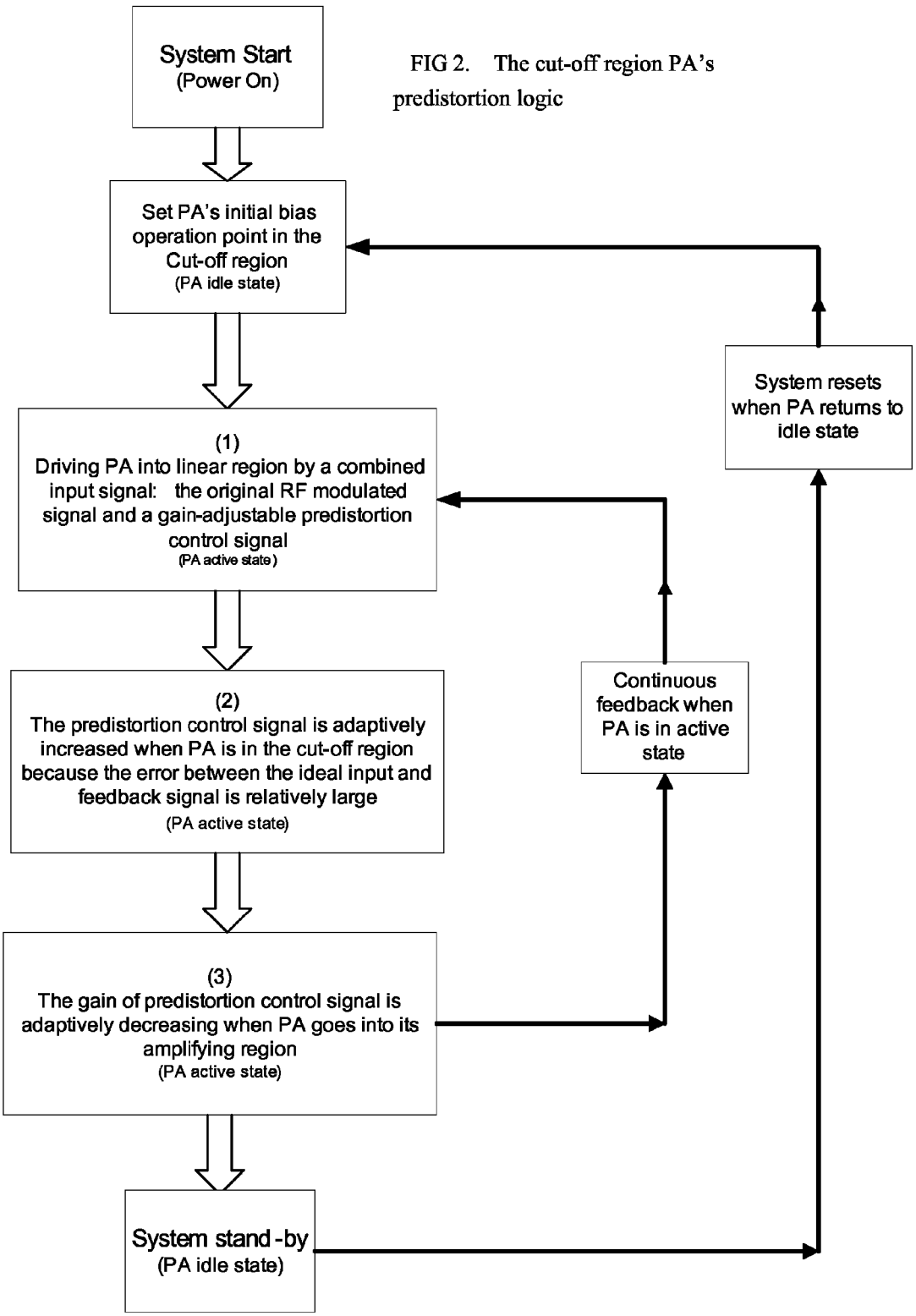
FIG 2. The cut-off region PA's predistortion logic

POWER AMPLIFIER PREDISTORTION METHODS AND APPARATUS

RELATED CASES

This application claims the benefit of U.S. Provisional Patent Application Ser. No. 60/876,640, filed Dec. 22, 2006, titled "POWER AMPLIFIER PREDISTORTION METHODS AND APPARATUS," which is incorporated by reference in its entirety for all purposes. This application also is related to U.S. patent application Ser. No. 11/262,079, filed Oct. 27, 2005, and its parent, U.S. patent application Ser. No. 10/137,556, filed May 1, 2002, now U.S. Pat. No. 6,985,704, issued Jan. 10, 2006, as well as U.S. Provisional Patent Application Ser. No. 60/897,746, filed Jan. 26, 2007; Ser. No. 60/898,312, filed Jan. 29, 2007, Ser. No. 60/969,127, filed Aug. 30, 2007, Ser. No. 60/969,131, filed Aug. 30, 2007, and Ser. No. 60/012,416, filed Dec. 7, 2007, the disclosures of which are incorporated herein by reference in their entirety for all purposes.

FIELD OF THE INVENTION

In one aspect, the present invention relates to predistortion methods for linearizing the response of a power amplifier (PA) and to obtain a higher power efficiency of the PA by setting initially the static-point, or bias, of the PA in the cut-off operation region (the "Cut-Off Region PA"). This aspect of the present invention is especially applicable to all wireless radio frequency (RF) transmitter systems to improve both the power efficiency and linearity of wireless transmission system.

In another aspect, the present invention relates to techniques for implementing predistortion in the power amplifier through the use of an analog multiplier. As with the first aspect, applications of the present invention are suitable for use with all wireless base-stations, access points, mobile handsets, mobile wireless terminals, portable wireless devices, and other wireless communication systems such as microwave and satellite communications.

BACKGROUND OF THE INVENTION

A fundamental component of wireless communications systems is the power amplifier (PA). Such wireless communications systems include a variety of broadband and multimedia services. In such systems, the power amplifier is supported by a wireless RF transmitter. The power efficiency of the PA is an important aspect of the operational efficiency of the system as a whole. The PA typically can be thought of as having three operational ranges: the linear (amplifying) region, the saturation region, and the cut-off region. In practice, the efficiency of a power amplifier is closely related to the static bias setting choice of operation region of such power amplifier. Setting a PA in the linear (amplifying) operation region of the PA will yield higher linear output characteristics, but operating with a bias in the linear region yields very low power efficiency. Setting the bias of a PA in either the saturation region or the cut-off region will yield higher power efficiency, but the output signal quality from the PA will be degraded by distortion due to the non-linearity of the PA in those regions. Such degraded output signal quality cannot meet the requirements of most RF transmitters and receivers. Power amplifiers used in current wireless transmission systems usually are biased so that their static-points are either in their linear region or linear-to-saturation region.

The non-linear operation of such power amplifiers causes distortion due to, among other things, what are referred to as intermodulation products in the output signal. Such non-linear products are so close to the desired signal and hence the non-linear products cannot be filtered out simply by conventional filtering technologies. In order to avoid such nonlinear distortions, the conventional solutions are (i) to back off the static-point of the PA from its saturation region to its amplifying region and/or (ii) to use predistortion methods to linearize the PA's characteristics.

Traditional digital and/or analog predistortion technologies for linearizing the response of power amplifiers are typically based upon the principles of error comparison and power matching. Existing predistortion methods and circuits for wireless transmitter systems offer some help in addressing the non-linear distortion of power amplifiers that are biased for initial operation either in the saturation region or close to it. However, such existing predistortion methods are typically unable to achieve an optimized balance between linearity and DC conversion efficiency because of the PA's configuration of linear-to-saturation region.

When a power amplifier is biased for initial operation in the saturation or near-saturation region, the related intermodulation products are also amplified with signal. Therefore, the PA will exhibit nonlinear characteristics such as the amplitude and phase distortions (AM-AM and AM-PM), which will lead to the undesirable inter-modulation interferences in the neighboring frequency band. There has therefore been a need for a predistortion device and method which will accurately provide a linearized output of the PA when biased in these ranges. In addition, these has been a need for a predistortion device and method which will provide a linearized output for PA's biased for initial operation in the cut-off region.

FIGURES

FIG. 1 is a schematic diagram of an embodiment of the predistortion system of the present invention.

FIG. 2 is a flow diagram illustrating an embodiment of the process of the present invention.

SUMMARY AND DETAILED DESCRIPTION OF THE INVENTION

The current and next-generation wireless communication systems will utilize improved PA efficiency technology for a variety of broadband and multimedia services, supported by an advanced wireless RF transmitter, in which a highly-efficient high power amplifier will provide substantially linear output to improve the transmitted quality and system performance while at the same time providing a cost savings both in terms of the equipment itself and the amount of power consumed during operation.

To provide improved performance, including minimizing DC power consumption, the present invention provides a power amplifier biased to operate initially in the cut-off region. However, biasing the power amplifier for initial operation in the cut-off region prevents the use of the conventional back-off linearization method, and a new predistortion solution is required. The solution of the present invention addresses both (i) the correction of the distortion in the cut-off region and (ii) the adaptive enlargement of the input signal power so that the PA can be linearized.

A power amplifier consumes the lowest DC power—and, thus, has the highest power efficiency—when its static operation point is originally set up in the cut-off region. One aspect of the present invention is to configure the initial static operation point to yield as small as possible a bias current so as to maximize both the power efficiency and the linearity. In an embodiment of the present invention, this low signal power is achieved by providing a novel predistortion controller wherein an adaptive variable is coupled with or controlled by an adaptive predistortion algorithm.

A predistortion architecture block diagram for the Cut-Off Region PA is shown in FIG. 1, in which an adaptive control signal used to correct the non-linear characteristics of a PA is multiplied with the modulated input signal to form a predistortion input of the PA. The output of the adaptive controller provides the predistortion control signal. In some embodiments of the invention, the adaptive control signal may be analog, and in other embodiments the adaptive control signal can be digital.

Referring still to FIG. 1, an RF signal $V_{RF}$ is provided by the RF modulator 10, and is supplied to a multiplier 11 and a Power Amplifier 12 for transmission via antenna 13. For the embodiment shown, the multiplier 11 is an analog multiplier. The output $V_{RF}$ of the modulator 10 is also supplied to a down converter 20, which is clocked by a local oscillator 40. The output of the down converter is provided in the form of signals I and Q to an analog-to-digital converter (ADC) 21. The A-D converter 21 puts out a series of bits which are supplied to address former logic 32, and also outputs I and Q signals ($V_d$) which are supplied to variables 22I and 22Q, respectively.

The output of the PA 12 is also monitored, and the output signal $v_o(t)$ is supplied to a down converter 26, similar in function to the down converter 20. A local oscillator 40 provides an input to the down converter 26. The down converter converts the $v_o(t)$ signal into I and Q components and feeds them to ADC 25. The I and Q outputs of the ADC 25 are supplied to variables 24I and 24Q, respectively.

The I and Q signals from the input signals (22I and 22Q) and output signals (24I and 24Q) are subtracted at 23I and 23Q respectively, with the difference being supplied to respective multipliers 35I and 35Q, where the multiplicand is an adaptive step size factor "µ" of the algorithm, with µ<1, The outputs of the address former 32I and 32Q serve as inputs to predistortion lookup table (which may be one or more tables) 33I-Q. The predistortion lookup table 33I-Q provides I and Q outputs to adders 34I and 34Q, and also to Adder 31. The adders 34I and 34Q also receives the respective outputs of the multipliers 35I and 35Q, and the sums are provided as correction inputs to the predistortion lookup table 33I-Q.

The Adder 31 provides its output to a digital-to-analog converter (DAC) 30, which in turn provides an analog input $V_P$ to multiplier 11, and serves as the predistortion signal for the PA 13.

From a functional, or process, standpoint, the operation of the predistortion architecture of FIG. 1 may be better understood from the flow diagram of FIG. 2.

In general, the predistortion control architecture performs three functions:
(1) Non-linear distortion correction and compensation while the PA is operating in the cut-off region;
(2) Adaptively adjusting the predistortion controller output power to drive the PA from its cut-off operation status into its linear region;
(3) Adaptively adjusting and decreasing the predistortion processor gain as the error signal is reduced when the PA is driven into its amplifying region.

Based on the predistortion architecture [1], the first logic of the predistortion circuit is the correction of the non-linear distortion through an adaptive tracking of the AM-AM and AM-PM distortions when the PA is set up in its cut-off region.

It must be pointed out that; however, the AM-AM and AM-PM distortions in the cut-off region can not be corrected completely because the nonlinear distortion products are much larger in magnitude than the predistortion controller output magnitude. The distortion products signal will dwarf the predistortion controller's.

Therefore, the predistortion processing in the cut-off region needs, at first, to drive adaptively the static-point of the PA into the amplifying region by combining the RF signal and predistortion control signal. After the PA gets into its amplifying region, the predistortion control signal will be amplified incidentally and such amplified predistortion signal's power will be adaptively adjusted according to the feedback non-linear distortion component. This means that the output power of the predistortion control circuit will adequately error-correct the non-linear distortion whenever the PA is in either the cut-off or the amplifying or saturation region.

The output power adjustment of the predistortion control circuit is dependent upon the predistortion adaptive algorithm. According to the feedback signal from the PA's output and the resulting error components, the output power of the adaptive algorithm will vary in both amplitude and phase. Meanwhile, the output signal controls adaptively the modulated RF signal by a multiplier, which actually forms the predistorted input signal of the PA. Whenever the static operation point of the PA is set up in the cut-off region, amplifying region, and saturation region, the predistorted input signal of the PA can adjust the PA's characteristics to keep it to be both a linear function and in the state of lowest power consumption.

The PA can be characterized by a level-dependent complex function G(x), so that its output can be expressed as $$v_o(t) = v_q(t) G[x_q(t)] \quad (3)$$

where $v_q(t)$ is the RF quadrature modulated signal that is an original input signal of the PA without predistortion processing, $x_q(t)$ is expressed as instantaneous power, and G is a level-dependent complex gain of the PA. When the predistortion processing is introduced, the actually input-output relation (3) of the PA becomes [1]

$$v_o(t) = (v_q(t) \times v_p) G[x_q(t) \times v_p] \quad (4)$$

where $v_p$ is the output component of predistortion controller and contains the amplitude and phase correction information to the non-linear characteristics of the PA.

Having fully described an embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

I claim:

1. A method for linearizing an output of a power amplifier in a wireless broadband transmitter, the method comprising the steps of:
   a) biasing the power amplifier to operate initially in a first bias point in a cut-off region;
   b) determining a first set of predistortion lookup table entries from a predistortion lookup table;
   c) applying the first set of predistortion lookup table entries to correct a radio frequency (RF) modulated signal while operating at the first bias point in the cut-off region;
   d) biasing a static point of the power amplifier to a second bias point in a linear region of the power amplifier;
   e) determining a second set of predistortion lookup table entries from the predistortion lookup table;

f) applying the second set of predistortion lookup table entries to the RF modulated signal, such that an error signal associated with a feedback component of the power amplifier and the RF modulated signal is reduced at the second bias point compared to the first bias point; and g) repeating steps (d) through (f) until the error signal is adequately corrected.

2. The method of claim 1 wherein the first and second gains are at least partly determined based on a comparison between an ideal input and a feedback signal.

3. The method of claim 1 wherein the first predistortion control signal comprises substantial correction of non-linear signal distortion.

4. The method of claim 1 further comprising:
determining a first error signal comparing an ideal input of the power amplifier to a feedback signal of the power amplifier;
reducing the magnitude of the first error signal; and
adaptively adjusting and decreasing a gain of the predistortion processor in response to the error signal being reduced.

5. The method of claim 1 wherein determining the first and second predistortion control signals comprise use of a lookup table.

6. The method of claim 1 wherein the output of the power amplifier is $v_o(t)=v_q(t)*G[x_q(t)]$, where $v_q(t)$ is a quadrature modulated signal, $G[x_q(t)]$ is a gain of the power amplifier, and $v_o(t)$ is the output of the power amplifier.

7. The method of claim 6 wherein an input-output relation based on the output of the power amplifier is $v_o(t)=(v_q(t)\times v_p)*G[x_q(t)\times v_p]$, where $v_p$ is a predistortion controller output component.

* * * * *